United States Patent
Feldbauer et al.

(10) Patent No.: US 8,325,622 B2
(45) Date of Patent: Dec. 4, 2012

(54) ADAPTIVE, SCALABLE PACKET LOSS RECOVERY

(75) Inventors: Christian Feldbauer, Graz (AT); Willem Bastiaan Kleijn, Stocksund (SE)

(73) Assignee: Google Inc., Mountain View, CA (US)

( * ) Notice: Subject to any disclaimer, the term of this patent is extended or adjusted under 35 U.S.C. 154(b) by 467 days.

(21) Appl. No.: 12/595,814

(22) PCT Filed: Apr. 4, 2008

(86) PCT No.: PCT/EP2008/054114
§ 371 (c)(1),
(2), (4) Date: Oct. 13, 2009

(87) PCT Pub. No.: WO2008/125523
PCT Pub. Date: Oct. 23, 2008

(65) Prior Publication Data
US 2010/0054279 A1 Mar. 4, 2010

Related U.S. Application Data

(60) Provisional application No. 60/907,711, filed on Apr. 13, 2007.

(30) Foreign Application Priority Data

Apr. 13, 2007 (EP) .................................. 07106140

(51) Int. Cl.
*H04J 1/16* (2006.01)
(52) U.S. Cl. ... 370/252; 370/465; 370/468; 375/240.01; 375/240.02; 375/240.03
(58) Field of Classification Search .................. 370/216, 370/252, 464, 465, 466, 468, 473, 474, 475, 370/476, 484, 486; 704/220, 219, 222, 223, 704/230, 262, 500; 375/240, 240.01, 240.02, 375/240.03, 240.22, 240.25, 242, 243; 714/1, 714/2, 100, 746, 750, 751, 752
See application file for complete search history.

(56) References Cited

U.S. PATENT DOCUMENTS 6,757,654 B1 * 6/2004 Westerlund et al. .......... 704/262
(Continued)

OTHER PUBLICATIONS

Komaki et al., "A Packet Loss Concealment Technique for VoIP Using Steganography", IEICE Transactions on Fundamentals of Electronics, Communications and Computer Sciences, Engineering Sciences Society, Tokyo, JP, Aug. 8, 2003, vol. E86-A, No. 8, pp. 2069-2072, XP001177867.

(Continued)

Primary Examiner — Abdullah Riyami
(74) Attorney, Agent, or Firm — Birch, Stewart, Kolasch & Birch, LLP

(57) ABSTRACT

A system for transmitting data packets representing a source signal across a packet data network is provided. The encoder comprises a first encoder (110) and a redundancy encoder (120). The redundancy encoding is generated with a bit rate continuously scalable, the bit rate being provided by a bit rate controller (142) that uses input from the network (130) and packet-loss rate information. At the decoder, recovery is performed by a parameter estimator based in part on information transmitted from the first encoder using information from previous and/or future blocks and in addition on redundant information. The method may be added to existing lossy source coding systems or may be used to enhance the quality of the reconstructed source signal even in scenarios without packet loss.

33 Claims, 5 Drawing Sheets

U.S. PATENT DOCUMENTS

| | | | | |
|---|---|---|---|---|
| 2003/0103523 | A1* | 6/2003 | Frossard et al. | 370/465 |
| 2005/0268200 | A1* | 12/2005 | Garudadri et al. | 714/746 |
| 2006/0271355 | A1* | 11/2006 | Wang et al. | 704/220 |
| 2006/0271373 | A1* | 11/2006 | Khalil et al. | 704/500 |
| 2010/0226262 | A1* | 9/2010 | Liu et al. | 370/252 |
| 2012/0008645 | A1* | 1/2012 | Anandakumar et al. | 370/474 |

OTHER PUBLICATIONS

Peinado et al., "Packet Loss Concealment Based on VQ Replicas and MMSE Estimation Applied to Distributed Speech Recognition", Acoustics, Speech, and Signal Processing, 2005, Proceedings (ICASSP '05), IEEE International Conference on Philadelphia, PA, USA, Mar. 18-23, 2005, Piscataway, NJ, USA, IEEE, Mar. 18, 2005, pp. 329-332, XP010792041.

Ryu et al., "Encoder Assisted Frame Loss Concealment for MPEG-AAC Decoder", Acoustics, Speech and Signal Processing, 2006, ICASSP 2006 Proceedings, 2006 IEEE International Conference on Toulouse, France, May 14-19, 2006, Piscataway, NJ, USA, IEEE, May 14, 2006, pp. V-169-V-172, XP010931316.

Bolot et al., Adaptive Error Control for Packet Video in the Internet, Proceedings of the International Conference on Image Processing (ICIP), Lausanne, Sep. 16-19, 1996, New York, IEEE, US, vol. 1, Sep. 16, 1996, pp. 25-28, XP010202070.

Extended European Search Report Application No. 11173350.7 dated Sep. 27, 2011.

F Mertz et al., "Packet Loss Concealment with Side Information for Voice over IP in Cellular Networks", ITG-Fachtagung Sprachkummunikation, Apr. 2006, pp. 1-4, XP000002658601.

Yannis Agiomyrgiannakis et al: "Conditional Vector Quantization for Speech Coding", IEEE Transactions on Audio, Speech, and Language Processing , IEEE Service Center, New York, NY, USA, vol. 15, No. 2, Feb. 1, 2007, pp. 377-386, XP011157492.

* cited by examiner

ADAPTIVE, SCALABLE PACKET LOSS RECOVERY

This application is the National Phase of PCT/EP2008/054114 filed on Apr. 4, 2008, which claims priority under 35 U.S.C. 119(e) to U.S. Provisional Application No. 60/907,711 filed on Apr. 13, 2007, and under 35 U.S.C. 119(a) to Patent Application No. 07106140.0 filed in Europe on Apr. 13, 2007, all of which are hereby expressly incorporated by reference into the present application.

FIELD OF THE INVENTION

The present invention relates generally to a method for transmitting data packets representing a source signal across a packet data network and in particular to methods and apparatus for, on the one hand, encoding parameters representing the source signal and, on the other hand, decoding these parameters. The present invention relates in particular to encoding and decoding methods and apparatus for packet loss recovery in lossy network systems. The present invention may be applied to discrete-time signals such as multimedia signals (speech, audio signal and motion picture).

BACKGROUND OF THE INVENTION

Audio-visual communication over packet data networks has become more and more common. However, existing systems are lossy, i.e., data packets representing the signals to be transmitted over the packet data networks may be lost. Methods to address packet loss can be divided into two groups: receiver-based and sender-based methods. Sender-based methods, which introduce redundancy in the transmitted bit stream, are generally more powerful but require changes in both encoder and decoder, whereas receiver-based methods require changes in the decoder only. Many commonly used sender-based methods employ block channel codes as redundancy (e.g., forward error correction (FEC)) with a constant redundancy bit rate, thus protecting the primary encoding against packet loss. Other sender-based methods are based on multiple-description coding (MDC). A drawback of MDC-based strategies is that they cannot easily be added to existing systems and that the packet-loss robustness is integrated into the source coder. Other existing methods for sender-based recovery of lost packets are based on adding to a primary coding system vector quantizers (VQs) that must be trained off-line, which do not provide any flexibility in the coding of the signal to be transmitted since these vector quantizers require extra computation and/or predetermined lookup tables. These existing methods usually are dependent on the primary encoding through discrete statistical models, e.g., states of Markov models referring to VQ cells or on a particular packet-loss scenario. A problem is that these dependencies require different estimators or the training of several statistical models for different rates and different scenarios. Thus, there is a need for providing improved methods and devices that would overcome at least some of these problems.

SUMMARY OF THE INVENTION

An object of the present invention is to wholly or partly overcome the above disadvantages and drawbacks of the prior art and to provide an improved alternative to the above techniques and prior art.

A further object of the present invention is to provide a system for transmitting over a packet data network data packets representing a signal source, an apparatus for encoding parameters of the signal source, an apparatus for decoding the data packets transmitted over the packet data network and improved methods for encoding parameters of the signal source and for decoding these parameters.

The present invention provides method and apparatus for increasing the robustness to packet loss in lossy coding systems communicating over a packet data network or a packet-switched network such as the internet or cellular telephone networks. The present invention may provide an improvement of lossy coding systems that do not provide sufficient robustness to packet loss. The present invention can be used as an extension of an existing lossy coding system, thus enabling the extended system to communicate with other extended systems with increased robustness to packet loss while communication with non-extended systems is still possible without increased robustness.

Hence, according to a first aspect of the present invention, an apparatus for encoding a source signal to be transmitted across a packet data network is provided.

According to a second aspect of the present invention, a method for encoding a source signal to be transmitted across a packet data network is provided.

The inventive apparatus and method for encoding the parameters of the source signal encode the parameters with a variable bit rate, which is continuously specified in the form of a bit rate control signal from a bit rate controller in response to input parameters such as a packet-loss statistics value. This is advantageous since the bit rate of the redundant encoding, or the packeting strategy, can then be adapted to the performance of the actual packet data network, thereby providing a more or less accurate redundant encoding by increasing or decreasing the bit rate, respectively. The redundancy rate may be changed for each coding block corresponding to a particular segment of the source signal. Another advantage is that such an apparatus for encoding can easily be added to existing encoders where the existing coder may be a legacy encoder.

According to an embodiment, the bit rate controller of the inventive apparatus for encoding may provide the bit rate control signal in response to both the packet-loss statistics value and information about conditions of the packet data network. In further embodiments, the information about conditions of the packet data network includes at least one of the following network parameters: current data load in said packet data network, data load policy of said packet data network and current cost per bit per second in said packet data network, which is advantageous since the variable bit rate may be adapted to the constraints and/or conditions of the network. As the allowable bit rate would in principle be infinite to provide the highest possible precision in transmission, parameters such as the current data load of the network limit the value of the bit rate allowed for the transmission of redundant encoding of the signal source.

According to a third aspect of the present invention, an apparatus for decoding a sequence of data packets transmitted across a packet data network, wherein each of the transmitted data packets includes a primary encoding and a redundant encoding of parameters representing a source signal, is provided.

According to a fourth aspect of the present invention, a method for decoding a sequence of data packets transmitted across a packet data network, wherein each of the transmitted data packets includes a primary encoding and a redundant encoding representing a source signal, is provided.

The inventive apparatus for decoding may easily be added to existing systems where a first decoder to decode the primary encoding may be a legacy decoder. A legacy decoder simply ignores the bit-stream component corresponding to the redundancy encoding while matched decoders, such as the apparatus of the present invention, use the redundancy encoding to improve the quality of the reconstructed signal in case of, e.g., packet losses.

Further, the inventive apparatus for decoding ensures good reconstruction quality and a constrained total rate since it decodes the parameter under the control of a bit rate control signal.

According to a fifth aspect of the present invention, a system for transmitting a sequence of data packets across a packet data network, wherein each of the transmitted data packets includes a primary encoding and a redundant encoding of parameters representing a source signal, is provided.

The high performance of the inventive system is partly due to statistical modelling at the apparatus for decoding, which modelling facilitates signal reconstruction when the bit stream is damaged. Further, as the inventive system is entirely based on an analytic, continuous source signal model, and as the present system uses computable quantizers, real-time adaptation of the redundancy encoding during transmission is enabled. In other words, the present invention provides a communication system which can be adapted to the actual packet loss scenario of the packet data network through reception of a bit rate control signal. Thus, the system may react to, and possibly prevent, network congestion.

The present methods and apparatus are also applicable in network scenarios without packet losses to, instead of retrieval of missing parameters, increase the reconstruction quality of the coding system.

Further objectives of, features of, and advantages with, the present invention will become apparent when studying the following detailed disclosure, the drawings and the appended claims. Those skilled in the art will realize that different features of the present invention can be combined to create embodiments other than those described in the following.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, in which.

All the figures are schematic and generally only show parts which are necessary in order to elucidate the invention, wherein other parts may be omitted or merely suggested.

DETAILED DESCRIPTION OF THE INVENTION

Figure 1:
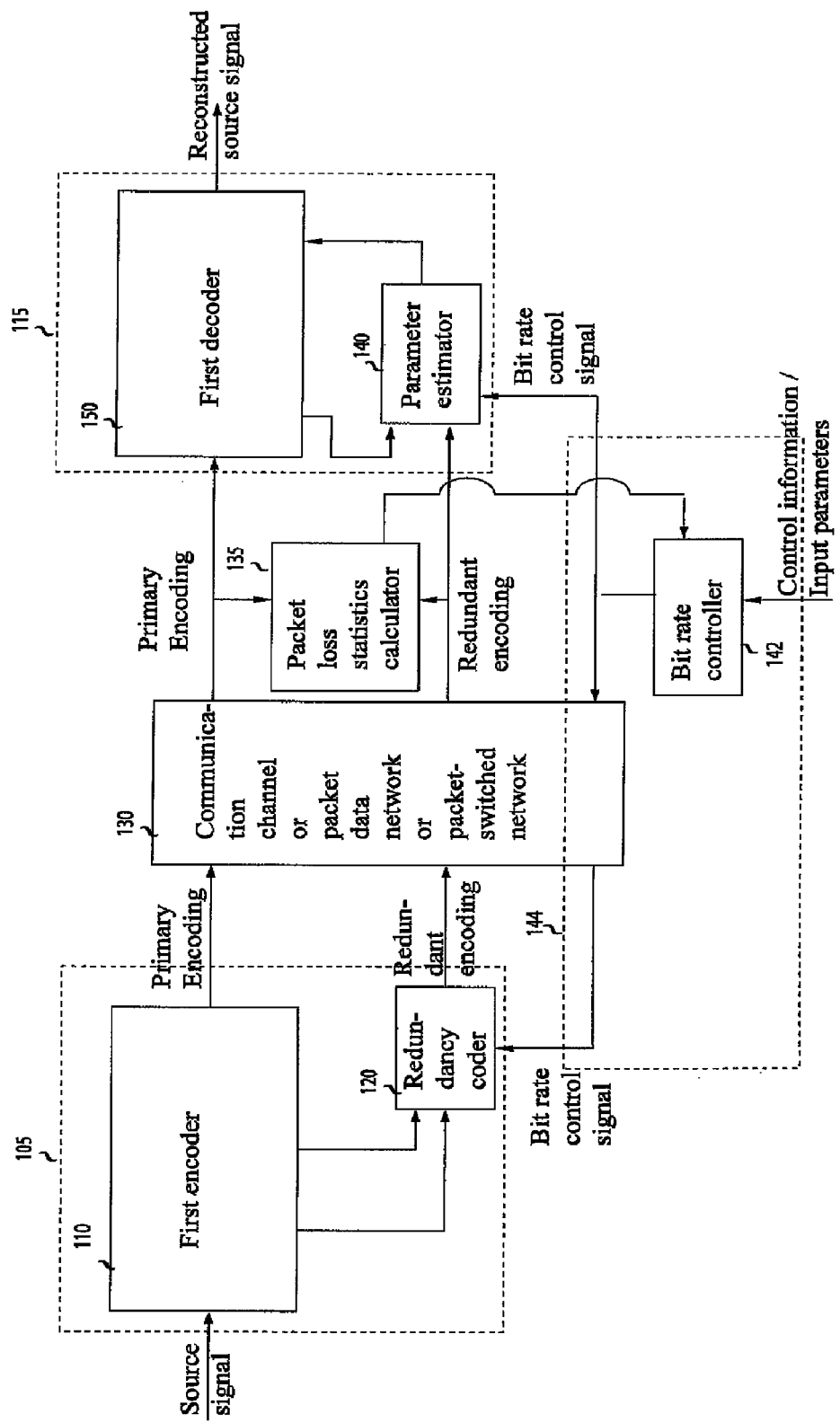
FIG. 1 shows a system for transmitting a source signal across a packet data network according to an embodiment of the present invention.

FIG. 1 shows a system from transmitting a source signal across a packet data network 130 according to an embodiment of the present invention. A source signal encoder or first coder 110 encodes a source signal and generates a primary encoding on a block-by-block basis, where a block typically is one or more time segments of the source signal. The blocks are usually but not necessarily of the same length. The source signal is generally encoded in the form of a sequence of data packets, each packet including a packet header. It is common but not necessary that the data packets are synchronous with the blocks corresponding to a particular time segment of the signal source, or a fraction thereof, or a set of segments.

In an embodiment, the primary encoding is assumed to be lossy, i.e., the reconstructed source signal generated by a corresponding source signal decoder or first decoder 150 in response to the received primary encoding is an approximation of the source signal. In particular embodiments, the source signal may be a speech signal, an audio signal, a motion picture, an audio-visual signal, or any other signal that may be encoded in a lossy way.

The data packets are transmitted over a communication channel or packet data network 130. If a packet is lost, some input information received by the first decoder 150 is missing, typically for one coding block. To maximize the quality of the reconstructed source signal, the missing parameters may be estimated by a parameter estimator 140. The parameter estimator 140 may operate in part in response to data received from other time blocks decoded by the first decoder 150. However, an improved estimate may be obtained if the parameter estimator operates in response to redundant information transmitted across the channel or packet data network 130.

Thus, in addition to the first coder 110 described above, the encoder 105 additionally includes a redundancy coder 120 to improve the performance of the parameter estimator 140.

With reference to FIG. 1, an embodiment of the apparatus 105 for encoding parameters of the source signal will be described. As shown in FIG. 1, the encoder or apparatus for encoding 105 includes a first coder 110 for generating a first set of parameters from the source signal and for performing a primary encoding of the first set of parameters. The encoder 105 further includes a redundancy coder 120 receiving from the first coder 110 the first set of parameters and the quantized first set of parameters. The Redundancy coder 120 performs a redundant encoding of a second set of parameters. In particular, the second set of parameters is generated using a subset (which can be the full set) of the first set of parameters and delayed quantized parameters generated by the first coder 110 from the first set of parameters. The redundancy coder 120 is adapted to encode the second set of parameters into a redundant bit stream having a variable bit rate corresponding to a received bit rate control signal. The bit rate control signal is provided by a bit rate controller 142 in response to a packet-loss statistics value received from a packet-loss statistics calculator 135 connected to the packet data network 130.

For a particular coding block, the encoded redundancy information produced by the redundancy encoder 120 is transmitted such that simultaneous loss of the parameters generated from the primary encoding and the corresponding redundant information encoded by the redundancy encoder is minimized.

In a particular embodiment, the second set of parameters may include information not encoded by the first coder 110 in the primary encoding. This allows increased precision of the reconstructed source signal if no packets are lost.

The bit rate provided to the redundancy coder 120 via the bit rate controller 142 is continuously variable, thereby allowing for the integer nature of bits. The redundancy bit rate or variable bit rate of the redundancy coder 120 is specified by the bit rate controller 142, which controller may be arranged at the encoder 105. However, the bit rate controller 142 may also be arranged at or near the decoder 115 as shown in FIG. 1 or any other location in the system.

The bit rate controller 142 determines the bit rate of the redundant encoding based on statistics of the packet-loss rate as seen by a packet-loss statistics calculator 136 arranged between the decoder 115 and the packet data network 130, i.e. on the receiver side of the system. However, the bit rate controller may also determine the bit rate based on prior knowledge and/or input parameters related to the conditions of the network. The variable bit rate should be identical for the encoder 105 and the decoder 115.

Information needed to specify the redundant bit rate at the encoder 105 and the decoder 115 (which requires very few bits) is transmitted in a redundant fashion using, e.g., a so-called feedback channel from the decoder 115 to the encoder 105 to ensure a robust transmission of the bit rate, as shown in FIG. 1.

In a particular embodiment, the packet-loss statistics calculator 135 estimates packet-loss statistics values by counting missing packets.

In a particular embodiment, the bit rate controller provides the bit rate control signal in response to both the packet-loss statistics value and information about the conditions of the packet data network 130. These conditions may be current data load in the packet data network, data load policy of the packet data network and current cost per bit per second in the packet data network.

The cost per bit per second may be set by a network control unit (not shown in the figures) such that the network load is reasonable, i.e., that the cost per bit per second increases when the network load increases and the cost per bit per second decreases when the network load decreases. The bit rate controller 142 has therefore the capability to trade quality of the transmission versus cost. As an example, the mean squared error, MSE, of the encoded parameters as a measure of distortion may be used. In the following, the monetary cost per bit per second is denoted by B. The mean squared error is a function of the redundancy rate $R_r$, which can be expressed as $MSE=MSE(R_r)$. Furthermore, the monetary cost B is set by the network control unit which is calibrated by a network operator (not illustrated in the figures). It is envisioned that the value of B can vary continuously. A reasonable objective for the bit rate controller 142 is to constrain the overall cost $BR_r$, which, for a given first coder implies that $BR_r$ is bound by a value $B_{TOT}$. For maximizing the quality, i.e., minimizing the distortion, $R_r$ is set to the maximum value allowed, which is $R_r=B_{TOT}/B$. In a further embodiment, the bit rate controller 142 minimizes a compound criterion based on quality and cost. As an example, the goal may be to find the value of $R_r$ that minimizes the cost criterion $\eta=MSE(R_r)+\lambda BR_r$, where $\lambda$ is a factor that sets the relative importance of the distortion and the monetary cost.

With reference to FIG. 1, an embodiment of the apparatus 115 for decoding a sequence of data packets transmitted across the packet data network 130 is described in the following. The decoder or apparatus for decoding 115 includes a first decoder 150 for performing a decoding of the primary encoding into a set of primary decoded parameters. The decoder 150 further includes a parameter estimator 140 for modelling, under the control of a bit rate control signal, the joint distribution of a set of estimated parameters and a set of decoded redundant parameters generated from the received redundant encoding, and for estimating the estimated parameters based on the modelled distribution. As for the encoder 105, the bit rate control signal is provided by a bit rate controller 142 in response to a packet-loss statistics value received from the packet-loss statistics calculator 135 connected to the packet data network 130.

In a particular embodiment, the estimated parameters are missing parameters or lost parameters from either one of the received primary encoding and the received redundancy encoding.

In a particular embodiment, the model applied to the distribution of parameters is a Gaussian mixture model, which will be explained in more detail later.

When parameters of the redundant encoding or the primary encoding are lost (for example because data packets are lost), the parameter estimator 140 estimates the lost or missing parameters (also called estimated parameters in the following). The estimation is based in part on information transmitted from the first coder 110 across the packet data network, using received primary encoding parameters from previous and/or future blocks. In addition, the estimation of the lost parameters is based on redundant information transmitted from the scalable redundant coder 120. As the bit rate of the redundant encoding varies as a function of the rate set by the bit rate controller 142, both the set of redundant parameters and the encoding precision with which the redundancy coder 120 encodes these redundancy parameters may vary. Thus, in contrast to the decoder of a conventional fixed quantizer, the parameter estimator 140 can not use a predetermined table for decoding the redundancy encoding. Instead, the parameter estimator 142 uses an estimation procedure in which the joint distribution of the set of parameters estimated (or output) from the parameter estimator 142 and the decoded redundant parameters generated from the redundancy encoding is modelled. In a further embodiment, the parameter estimator 142 may model the distribution of the set of parameters estimated from the parameter estimator 142, the set of decoded redundant parameters generated from the received redundancy encoding and the decoded parameters generated from the received primary encoding. Except for the effect of quantization, the joint distribution of all parameters used can be extracted using a database in which data of the type of signal source that is transmitted has been collected. A basic joint distribution of the parameters is then obtained based on training using the data in a database and the processing of the data by encoder 105. Finally, the distribution may be corrected for the effect of quantization. This last step is done analytically and in real-time based on rate information provided by controller 140.

The correction of the said joint distribution for the quantization of the redundant parameters has to be done as the statistics of these parameters vary with the redundancy rate provided by the bit rate controller 142. Thus, upon receiving the redundant bit rate from the bit rate controller 142, the parameter estimator 140 can determine the specification of the distribution of the lost parameters or parameters to be estimated (also called estimated parameters or output parameters), given the quantized redundancy parameters, and the received parameters generated from the received primary encoding. In an embodiment, the distribution of the estimated parameters is the conditional probability distribution of these parameters given the quantized redundancy parameters and the received parameters generated from the primary encoding.

In a particular embodiment, the distribution is described as a Gaussian mixture model. Thus, using the conditional probability distribution of the estimated parameters, given the known quantized redundant parameters generated from the redundant encoding and/or the parameters generated from the received primary encoding, the parameter estimator 140 can model the joint distibution of these parameters and then estimate the estimated parameters. Different types of computation may be used to estimate the parameters. In a preferred embodiment, an estimate that minimizes the squared error is used. The minimum mean square estimate is simply the mean value of the missing parameters for the conditional probability distribution function with the known information as conditioning parameters.

Figure 2:
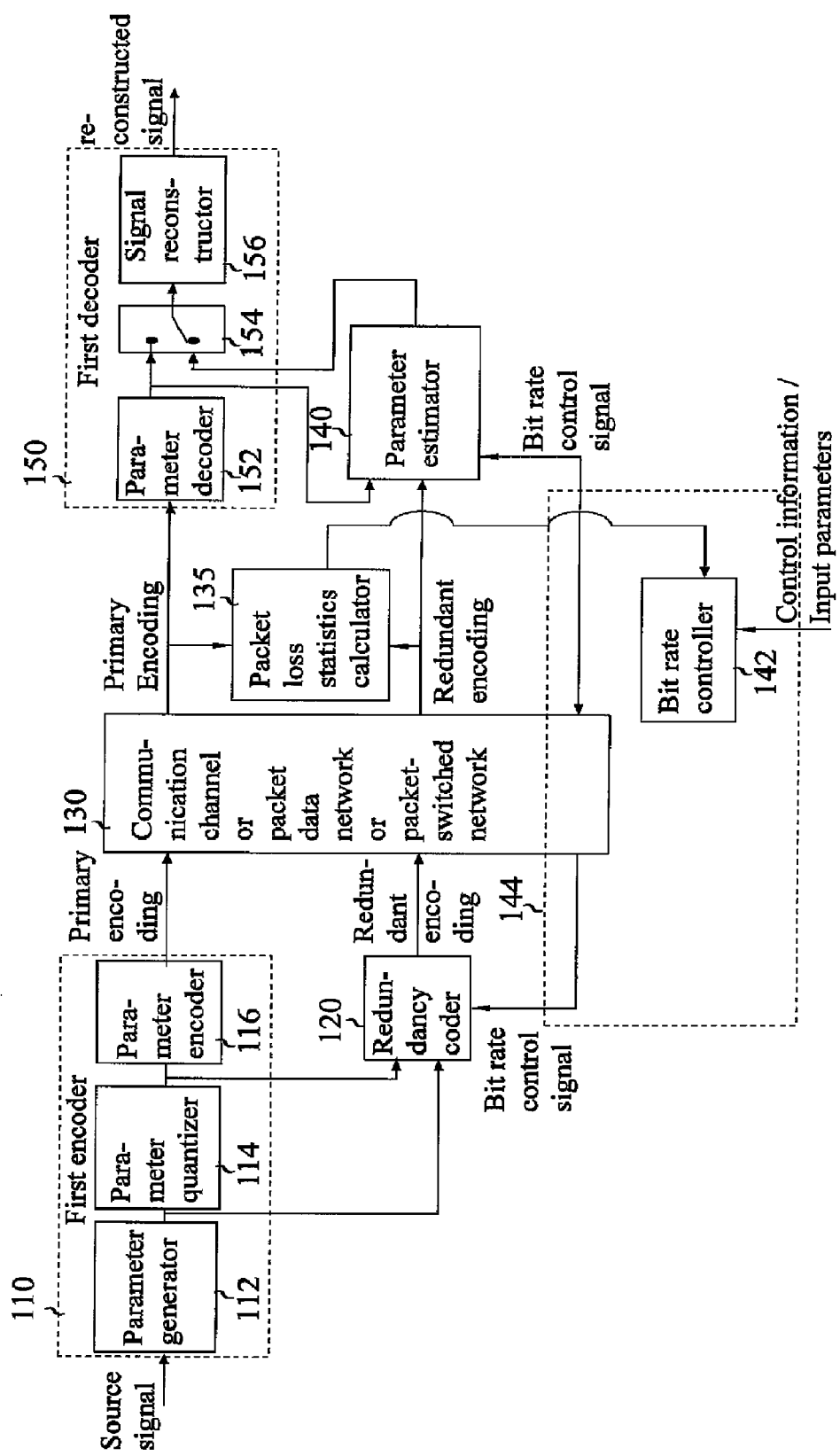
FIG. 2 shows a system for transmitting a source signal across a packet data network according to another embodiment of the present invention.

FIG. 2 shows a system from transmitting a source signal across a packet data network 130 according to another embodiment of the present invention, in which the first coder 110 and the first decoder 150 are shown in more detail.

In general, any lossy source signal encoder or lossy first coder 110 can be considered as a three step processor. The first step is to generate a first set of parameters from the input source signal (also called source signal) in a parameter generator 112. The second step is to quantize the first set of parameters in a parameter quantizer 114, and the third step is to generate the primary encoding by encoding the quantized first set of parameters in the parameter encoder 116.

The parameters generated by the parameter generator 112 and the parameter quantizer 114 are accessible outside the first coder 110 and may be used by the redundancy coder 120 to achieve a low implementation complexity. The redundancy coder 120 generates a redundancy encoding at a desired redundancy bit rate or variable bit rate provided by the bit rate controller 142 using a subset of the first set of parameters and a delayed set of the quantized parameters generated from the first set of parameters, also called delayed quantized parameters. Thus, the redundancy encoding generated by the rate-scalable redundant coder 120 may be encoded in a layered way or by means of predictive encoding.

The primary encoding generated by the source signal encoder 110 (or the first coder 110) and the redundancy encoding generated by the redundancy coder 120 are transmitted over a communication channel or packet-switched network or packet data network 130. For a packet switched network, the primary encoding and the redundancy may be packed into different packets or into a single packet. For the latter case, either the stream of primary encodings or the stream of redundancy encodings needs to be delayed before the packeting.

A source signal decoder or first decoder 150 receives the stream of primary encodings and a parameter estimator 140 receives the stream of redundancy encodings. However, some packets, and therefore, some primary encodings and/or some redundancy encodings may have been lost by the packet data network 130. For the decoding process of each signal block, four different scenarios may emerge: both the primary encoding and the redundancy encoding is received; the primary encoding is lost, but the redundancy encoding is received; the primary encoding is received, but the redundancy encoding is lost; and both the primary encoding and the redundancy encoding is lost. Appropriate decoding scenarios for each of these situations are described in the following.

When only the primary encoding is available, the first decoder 150 may function normally by selecting the decoded parameters from the parameter decoder 152 in the selector 154 to be used for reconstructing the source signal by the source signal reconstructor 156.

When only the redundancy encoding is available, the parameter estimator 140 generates an estimate of the lost parameters based on the redundancy encoding, on available past (and/or future) parameters, and on prior information about the distribution of the source-coder parameters which corresponds to parameters collected to a database and related to a type of source signal. In this case, the selector 154 selects the estimated parameters to be used for reconstructing the source signal.

When both the primary encoding and the redundancy encoding are available, the parameter estimator 140 generates an enhanced estimate of the current parameters based on the redundancy encoding, on the current parameters decoded from the primary encoding, on available past (and/or future) parameters, and on prior information about the distribution of the source-coder parameters. The selector 154 selects the estimated parameters to be used for reconstructing the source signal.

When both the primary encoding and the redundancy are lost, the parameter estimator 140 generates an estimate of the estimated or lost parameters based on available past (and/or future) parameters and on prior information about the distribution of the source-coder parameters. The selector 154 selects the estimated parameters to be used for reconstructing the source signal also in this case.

Figure 3:
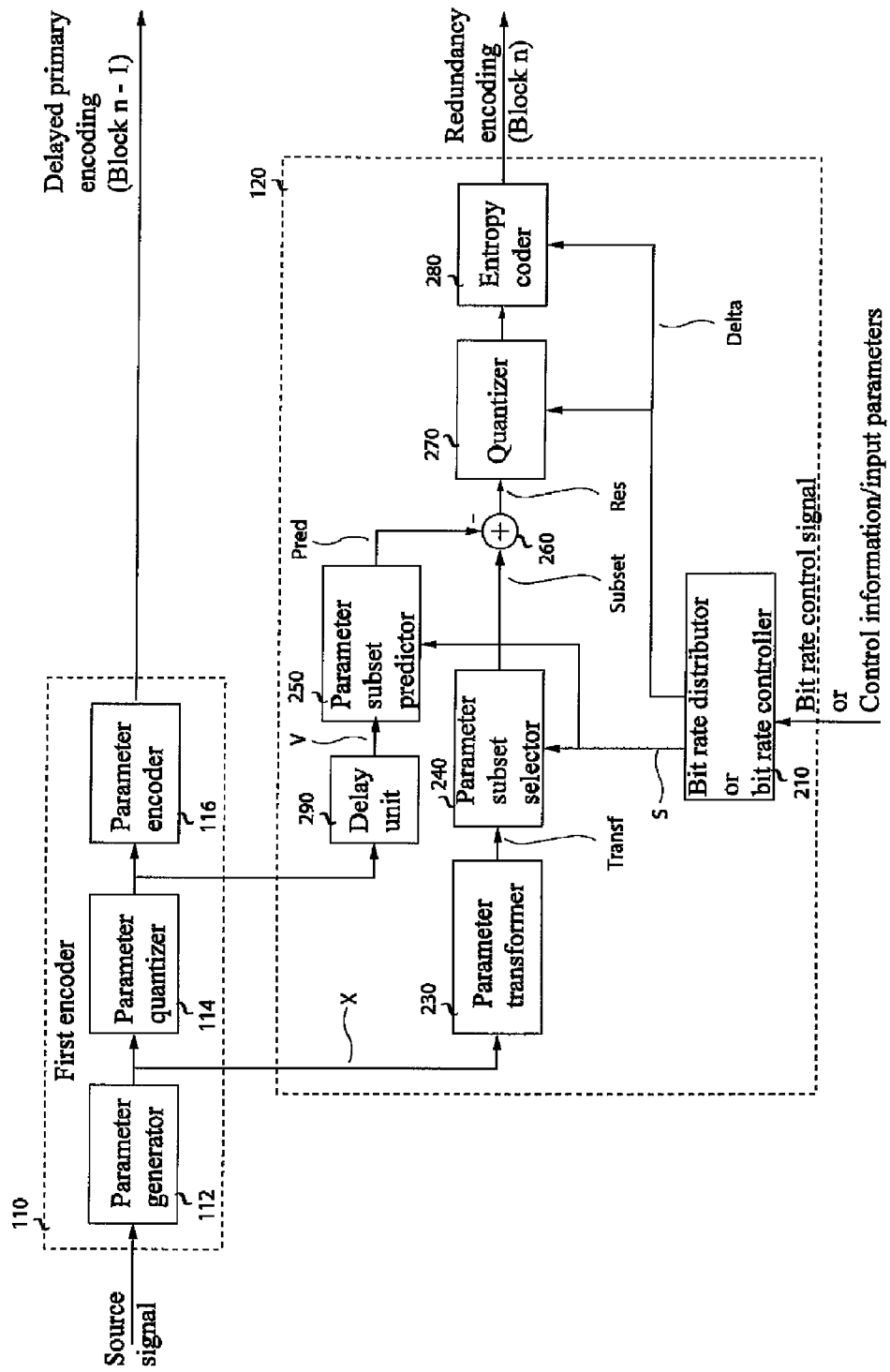
FIG. 3 shows an apparatus for encoding parameters of a signal source according to an embodiment of the present invention.

FIG. 3 shows an apparatus 120 for encoding parameters of a signal source according to an embodiment of the present invention.

The apparatus for encoding 120 shown in FIG. 2 may be equivalent to the apparatus 120 for encoding that will be described with reference to FIG. 3.

The redundancy coder 120 may exploit the parameter vector of the previous block by means of a predictive coding structure composed of a delay unit 290 for delaying the quantized parameters generated by the first coder 110 from the first set of parameters and a parameter subset predictor 250 for predicting, under the control of the bit rate control signal, a set of predicted quantized parameters based on the delayed parameters. Further, the redundancy coder 120 includes a subtractor 260 for generating redundant parameters by subtraction of the set of predicted quantized parameters from the first set of parameters generated by the first coder 110 and at least one quantizer for quantizing, under the control of the bit rate control signal, the redundant parameters. Finally, an entropy coder 280 encodes, under the control of the bit rate control signal, the quantized redundant parameters thus generating a redundant bit stream.

In a particular embodiment, in order to facilitate continuous scalability of the redundancy bit rate, the encoding of the redundant parameters obtained by the subtractor 260 is based on a bank of uniform scalar quantizers 270. Alternatively, the quantizer 270 may be a vector quantizer.

In another particular embodiment, the quantizer 270 operates on the basis of a statistical model. This facilitates setting the redundancy rate to a desired value. In a particular embodiment, this model is a Gaussian mixture model.

The bit rate spent on the redundancy encoding is typically relatively low for packet-loss protection. Such a low bit rate and the usage of a bank of uniform scalar quantizers 270 leads, in general, to the encoding of only a subset of the first set of parameters (the source-coder parameters) or a transformed set of source coder parameters in the redundancy coder 120. The need for only a subset of the parameters is a function of the dependencies between the parameters and of the distortion criterion that is used. The need exists, e.g., for the case of parameters that are highly correlated and subject to a unweighted squared-error distortion criterion.

In a particular embodiment, in which the parameters of the first set are identical, encoding one of the parameters at a rate of, e.g., H results in significantly lower distortion than encoding both parameters at H/2. The validity of this argument decreases progressively with decreasing dependency between the parameters.

In another particular embodiment, in which the parameters are independent, both parameters would have to be encoded at a rate of H/2 to obtain the optimal rate-distortion performance. However, as is well known to those of ordinary skill in the art, in the case of applying an appropriate transform to parameters with identical marginal distribution to make the transformed parameters independent, a similar relation between the dependency of the non-transformed parameters and the importance of a subset of the transformed parameters exists.

The yet unquantized parameters generated by the parameter generator 112, i.e. the first set of parameters, may be transformed by the parameter transformer 230. The transform applied by the parameter transformer 230 depends on prior information about the distribution of the source-coder parameters and on the underlying distortion criterion. The objective of applying the transform is to make the parameters mutually independent to decrease the redundancy bit rate at a given average distortion and to simplify the computation of the distribution of the redundancy bit rate.

In case of a squared-error distortion criterion, the Karhunen-Loève transform (KLT) may be applied. Applying a linear transform such as the KLT to the column vector x that contains the first set of parameters (or source-coder parameters), i.e., the input of the parameter transformer 230, the output of the parameter transformer 230 is mathematically expressed as $$\tilde{x} = T \cdot x, \qquad (1)$$

where $\tilde{x}$ denotes the transformed parameters.

The application of the transform may be skipped, particularly in the case when the parameters of the first step are already mutually independent, or in the case when only an insignificant reduction of the redundancy bit rate at a given average distortion can be achieved. Skipping the application of the transform is mathematically expressed by setting T=I, where I represents the identity matrix.

The output of the parameter transformer 230 may be passed to a parameter subset selector 240. Depending on the redundancy bit rate distribution corresponding to the bit rate control signal provided by the bit rate controller 142, the parameter subset selector 240 outputs those elements of the transformed-parameter vector $\tilde{x}$, which were allocated a positive, non-zero redundancy bit rate. In matrix notation, the operation of the parameter subset selector 240 can be expressed as $$\check{x} = P_{\check{x}} \tilde{x}, \qquad (2)$$

where $P_{\check{x}}$ is the corresponding selection matrix. The form of the selection matrix is described with the following illustrative example. For a given redundancy bit rate distribution that allocates bit rate, for instance, only among the second and the third element of the transformed parameter vector, the corresponding selection matrix is $$P_{\check{x}} = \begin{bmatrix} 0 & 1 & 0 & 0 & \ldots & 0 \\ 0 & 0 & 1 & 0 & \ldots & 0 \end{bmatrix}.$$

Additionally, an index subset $S \subset \{1, 2, \ldots, \dim \tilde{x}\}$ may be introduced. For the case of the above illustrative example, the index subset can be expressed as $S = \{2, 3\}$.

In a particular embodiment, the first set of parameters is directly provided to the parameter selector 240, which selects the subset of selected parameters from the first set of parameters and provide this subset of selected unquantized parameters to the subtractor described above, where the first set of parameters subject to the operation of the subtraction is the set of selected unquantized parameters.

In an embodiment, the bit rate control signal is provided to a bit rate distributor 210 which, in its turn, provides the bit rate control signal to the parameter subset selector 240, the parameter subset predictor 250, the quantizer 270 or the plurality of quantizers 270 and the entropy encoder 280, as shown in FIG. 3. However, the bit rate control signal may directly be provided from the bit rate controller 142 to the parameter subset selector 240, the parameter subset predictor 250, the quantizer 270 or the plurality of quantizers 270 and the entropy encoder 280.

The computation of the redundancy bit rate distribution will be described later in this text.

The quantized parameters generated by the parameter quantizer 114 are accessible outside the first coder 110 to achieve a low implementation complexity. However, if the quantized parameters are not accessible, they need to be generated either from the primary encoding or from the first set of parameters (or unquantized parameters) generated from the source signal. In a particular embodiment, the primary encoding may be delayed, using a primary-encoding delay unit (not shown in the figures), with respect to the redundant encoding. In another particular embodiment, the redundant encoding may be delayed with respect to the primary encoding.

The primary encoding of one source signal segment may be grouped with redundant encoding of another source signal segment into a data packet to be transmitted over the packet data network 130.

The delay unit 290 delays the quantized parameters generated by the parameter quantizer 114 of the first coder 110 and a column vector comprising the delayed quantized parameters is denoted by v. For the example packet structure presented in FIG. 4, the delay is one block for the primary-encoding delay unit as well as for the delay unit 290. The delayed primary encoding can directly be packed and does not need to be further delayed before the packeting together with the redundancy generated by the redundancy coder 120. It is preferred that the redundant encoding and the primary encoding of a particular signal block are in different packets.

The parameter subset predictor 250 predicts the subset of transformed parameters from the delayed quantized parameters generated by the first coder 110 from the first set of parameters. In the case of a squared-error distortion criterion, the optimal predictor is the minimum mean squared-error (MMSE) estimator and can be expressed as $$\bar{\check{x}} = E\{\check{X}|V=v\}, \qquad (3)$$

where $E\{\cdot\}$ represents the expectation operator. As is common in the art, a capital letter for a vector represents a random variable, while a lower-case letter represents an observation of the underlying random variable. An approximation of the MMSE estimator can be implemented based on a model for the joint distribution $p\check{x}v(\check{x},v)$ using for instance a Gaussian mixture model (GMM). In a further embodiment, an alternative estimator, e.g., a linear estimator, may be used for the parameter subset predictor 250.

The subtractor 260 subtracts the set of predicted parameters generated by the parameter subset predictor 250 from the first set of parameters. Alternatively, the subtractor 260 may subtract the set of predicted parameters generated by the parameter subset predictor 250 from a subset of unquantized selected parameters generated by the parameter subset selector 240 from the first set of parameters. Alternatively, the subtractor 260 may subtract the set of predicted parameters generated by the parameter subset predictor 250 from a subset of selected parameters generated by the parameter subset selector 240 from a first set of transformed parameters. The output of the subtractor 260 is a vector containing the redundant parameters, or prediction residuals, $r = \bar{x} - \tilde{x}$.

In an alternative implementation, prediction may be skipped, i.e., the redundancy coder 120 may be implemented without the delay unit 290, without the parameter subset predictor 250, and without the subtractor 260. In this alternative implementation, the signals to be used as input by the bank of uniform scalar quantizers 270 are defined as $r = \bar{x}$, and an appropriate adaptation of the implementation of the parameter estimator 140 must be made.

The elements of the vector $r = [r_i]$, $i \in S$ may be uniformly scalar-quantized by a bank of uniform scalar quantizers 270 according to the following expression:

$$\check{r}_i = q_i(r_i) = \text{round}\left(\frac{r_i - E\{R_i\}}{\Delta_i}\right) \cdot \Delta_i + E\{R_i\}, \quad (4)$$

where $\Delta_i$ is the individual quantization step size of an individual uniform scalar quantizer $q_i(\bullet)$. The quantization step sizes are computed from the redundancy bit rate distribution by the redundancy bit rate distributor 210 or the bit rate controller 142 and may change as functions of time. The output of the bank of uniform scalar quantizers 270 are a set of quantized redundant parameters or scalar-quantized prediction residuals $\check{r}_i$, $i \in S$.

In a particular embodiment, the bit rate control signal provided by the bit rate controller includes information about the quantization step sizes. Further, the bit rate control signal may include the number of bits available for transmission of the data packets.

The final step of the redundancy coder 120 described with reference to FIG. 3 is to encode the quantized redundant parameters (or scalar-quantized prediction residuals) by means of an entropy coder 280, which is preferably an arithmetic coder. Since the redundancy bit rate is continuously variable, the entropy coder 280 operates under the control of the bit rate control signal, i.e., in a scalable manner. This scalability can be achieved by approximating the univariate probability mass functions for the distributions of the redundant parameters. The univariate probability density functions for the distributions of the redundant parameters (non-quantized prediction residuals $pR_i(r_i)$ may be modelled by GMMs. The desired quantizer step size can then be computed using well-known high-rate theory relations between rate and step size for known distribution. The output of the entropy coder 280, which is the output of the redundancy coder 120, is a variable-length bit sequence representing the redundancy encoding.

Figure 4:
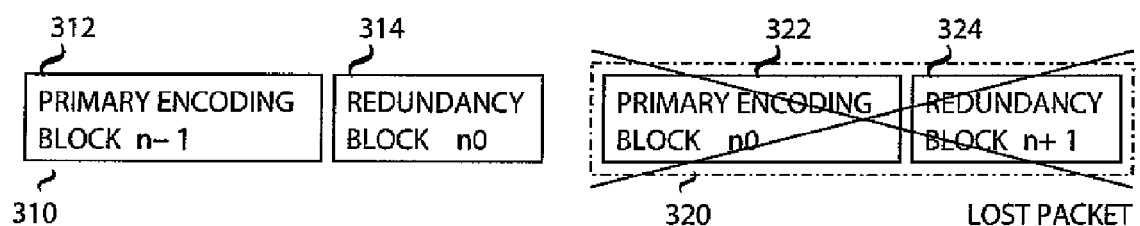
FIG. 4 shows a packet structure according to an embodiment of the present invention, which packet structure may be used in the embodiments described with reference to FIGS. 1-3 and 5.

FIG. 4 a packet structure according to an embodiment of the present invention, which packet structure may be used in the embodiments described with reference to FIGS. 1-3 and 5.

It is assumed that redundancy encoding of a block and the primary encoding of a block delayed by one block relative to the redundancy encoding's block are packed or regrouped together into a single packet 310. The total payload of the single packet 310 consists of the part of the packet's payload destined for the primary encoding 312 and the part of the packet's payload destined for the redundancy encoding 314.

Other packet structures may be used in the present invention. For example, a packet structure containing either one of the following alternatives may be used: the primary encoding of a block and two redundancy encodings that provide redundancy for two blocks posterior to the primary encoding's block or for two blocks prior to the primary encoding's block, or for one block prior to the primary encoding's block and one block posterior to the primary encoding's block. The redundancy coder 120 has then to be adapted accordingly.

FIG. 4 particularly shows an example for a packet-loss scenario in which two consecutive packets are shown, the single packet 310 and the single packet 320 subsequent to the single packet 310. In this example, it is assumed that the latter one is lost by the network 130.

Figure 5:
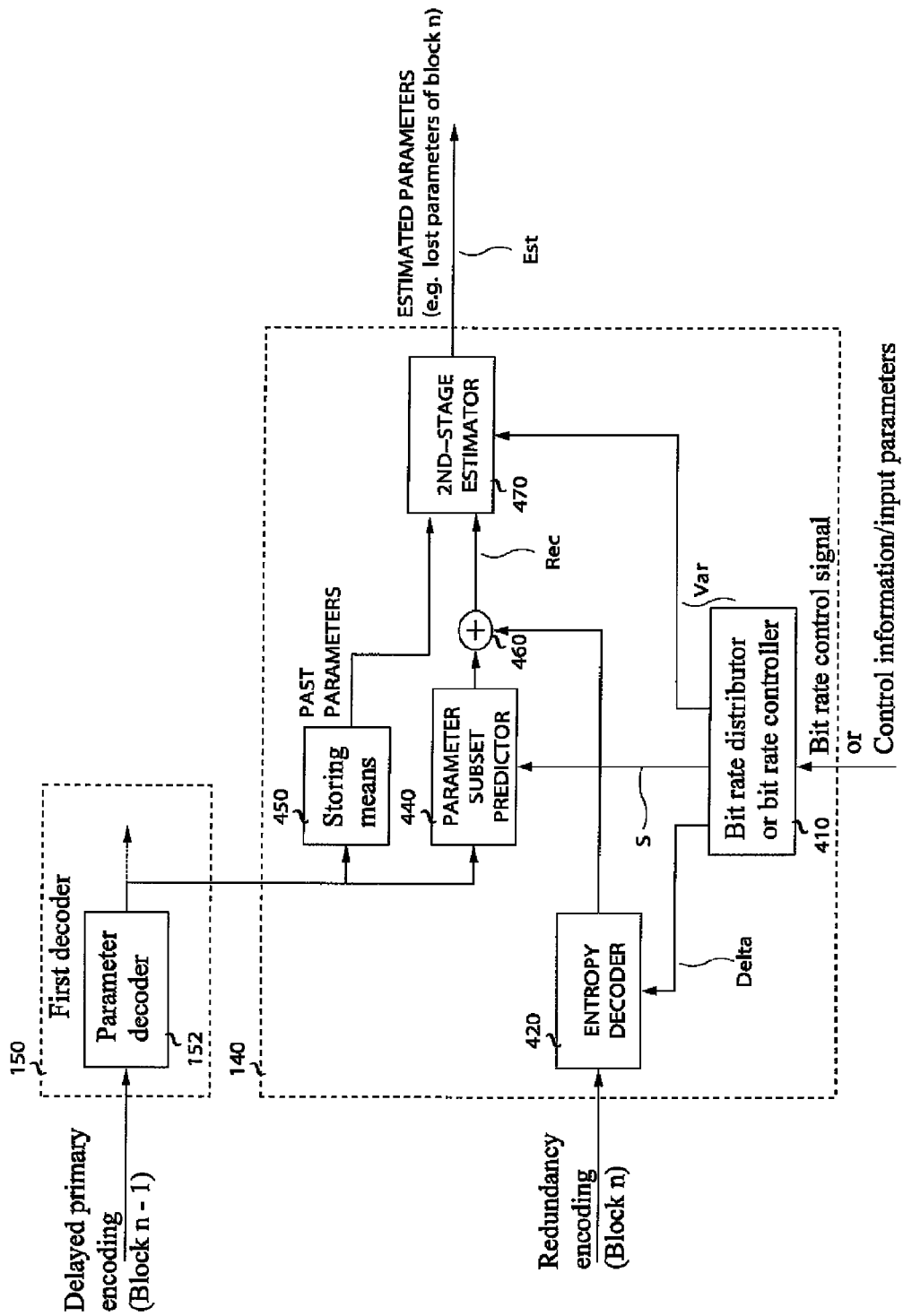
FIG. 5 shows an apparatus for decoding data packets transmitted across a packet data network according to an embodiment of the present invention.

FIG. 5 shows an apparatus for decoding data packets transmitted across a packet data network according to an embodiment of the present invention.

The apparatus for decoding shown in FIG. 5 may decode the data packet described with reference to FIG. 4, i.e., the single packet 310 comprising the primary encoding of block n−1 and the redundancy encoding of block n.

The received redundancy encoding is decoded by the entropy decoder 420, which outputs decoded redundant parameters. As for the entropy coder 280 described above with reference to FIG. 3, the entropy decoder 420 needs to operate rate-scalable.

The received primary encoding is decoded by the parameter decoder 152. The decoded primary parameters generated by the parameter decoder 152 are accessible outside the source signal decoder 150 to achieve a low implementation complexity. If the decoded parameters were not accessible, they would need to be generated from the received primary encoding.

In a particular embodiment, a buffer or storing means 450 may receive the decoded primary parameters and stores them such that they are available for the current as well as for the next $N_p - 1$ coding blocks. The output of the buffer or storing means 450 is the set of decoded parameter vectors for the blocks $n - N_p, n - (N_p - 1), \ldots, n-2, n-1$ and an indication of the availability for each of these blocks. This output is used as an input by a second-stage estimator 470.

The decoded primary parameter vector of block n−1, possibly augmented by parameters of even earlier blocks, or blocks after block n as described below, is used by a parameter subset predictor 440 to predict a subset of predicted parameters. The operation of the parameter subset predictor 440 is equivalent to the operation of the parameter subset predictor 250. The adder 460 reconstructs the parameter subset by adding the decoded redundant parameters generated by the entropy decoder 420 and the output of the parameter subset predictor 440. The set of added parameters output by the adder 460 is denoted by $\bar{x}$ and is used as another input for the second-stage estimator 470.

If the receiving part of the communication system has a jitter buffer or a similar mechanism that involves a further delay, the parameter estimator 140 may access data packets that are future relative to the lost packet. The decoded parameter vectors obtained from the primary encodings from these future packets may be used as additional input for the second-stage estimator 470. In an alternative embodiment of the parameter estimator 140, the function of the buffer or storing means 450 may be extended to store past as well as future decoded primary parameters such that the output of the buffer 450 is the set of decoded parameter vectors for the blocks $n - N_p, \ldots, n + N_f$ and an indication that tells the second-stage estimator 470 which of these blocks are available (i.e., not lost).

In a particular embodiment, the second-stage estimator 470 uses decoded parameters from the primary encodings of the blocks $n - N_p, \ldots, n + N_f$ together with an indication of the availability for each of these blocks and the reconstructed uniformly scalar-quantized parameter subset of block n as input. The output of the second-stage estimator 470 is an estimate of the source-coder parameter vector of block n, i.e. the redundancy encoding. This allows the second-stage estimator 470 to be used in several loss scenarios. Depending on whether the decoded parameters from the primary encoding of block n is lost or available, the output of the second-stage estimator 470 is either an estimate of the lost source-coder parameter vector or an enhanced version of the received source-coder parameter vector.

In the case of a squared-error distortion criterion, the optimal estimator is the MMSE estimator $$\hat{x} = E\{X|Y=y\}, \quad (5)$$

where y is a column supervector that combines all available decoded parameter vectors from the primary encodings of the blocks $n-N_p, \ldots, n+N_f$, said vectors denoted by the column supervector w, and the reconstructed uniformly scalar-quantized transformed parameter subset of block n, said subset denoted by the column vector $\bar{x}$. A column supervector is a vertical concatenation of elements that may be column vectors. An approximation of the MMSE estimator can be implemented based on a model for the joint distribution pXY(x,y). Since Y depends on the loss scenario (i.e., which blocks are available in the current loss scenario) and on the redundancy bit rate, the distribution pXY(x,y) is dynamically generated for the current loss scenario and redundancy bit rate from a single static GMM.

A single GMM models the distribution of a random supervector Z that combines a vector of non-quantized source-coder parameters, i.e., the first set of parameters generated by the parameter generator 112 at coding block n and quantized source-coder parameter vectors, i.e. the quantized parameters generated by the parameter quantizer 114, of the $N_p+N_f+1$ consecutive blocks $n-N_p, \ldots, n+N_f$:

$$p_Z(z) \approx \sum_{m=1}^{M} p_C(m) \mathcal{N}(z \mid \mu^{(m)}, C^{(m)}) \quad (6)$$

$\mathcal{N}(z|\mu^{(m)}, C^{(m)})$ is a multivariate Gaussian density with index m, which has mean $\mu^{(m)i}$, covariance matrix $C^{(m)}$, and prior probability $pC^{(m)}$. The parameters of the GMM $\mu^{(m)}$, $C^{(m)}$, and $pC^{(m)}_i \forall m \in \{1, 2, \ldots, M\}$ must be trained using an appropriate algorithm such as the EM algorithm. Generating pXY (x,y) from pZ(z):

The vector X is a component of the supervector Z. That is, $$X = P_X \cdot Z, \quad (7)$$

where $P_X$ is the corresponding selector matrix that extracts the appropriate elements of Z to form X.

The supervector Y is a concatenation of W and $\bar{X}$. That is, $$Y = \begin{bmatrix} W \\ \bar{X} \end{bmatrix}. \quad (8)$$

The supervector W is a component of the supervector Z. That is, $$W = P_W \cdot Z, \quad (9)$$

where $P_W$ is the corresponding selector matrix that extracts the appropriate elements of Z to form W.

The vector $\bar{X}$ can be generated from X by $$\bar{X} \approx P_{\bar{X}} \cdot T \cdot X + P_{\bar{x}} \cdot N, \quad (10)$$

where N is an additive noise to model the effect of the quantization. This additive noise is described in more detail later in the text.

Using equations (7), (9), and (10), equation (8) can be written as $$Y \approx \begin{bmatrix} P_W \\ P_{\bar{X}} \cdot T \cdot P_X \end{bmatrix} \cdot Z + \begin{bmatrix} 0 \\ P_{\bar{X}} \cdot N \end{bmatrix}, \quad (11)$$

where 0 is a column vector whose elements are zeros. 0 has the same dimension as W: dim 0=dim W. For notational simplicity, the matrix $P_Y$ is introduced and defined as:

$$P_Y = \begin{bmatrix} P_W \\ P_{\bar{X}} \cdot T \cdot P_X \end{bmatrix}. \quad (12)$$

The effect of the bank of uniform scalar quantizers 270 is modelled for each mixture component of the GMM by additive, zero-mean, Gaussian noise independent of all other random variables. The parameters of the GMM to model pXY (x,y) that are required to approximate the MMSE estimate in the second-stage estimator 470 are the mean vectors $$\mu_X^{(m)} = P_X \mu^{(m)} \text{ and} \quad (13)$$

$$\mu_Y^{(m)} = P_Y \mu^{(m)} \quad (14)$$

and the covariance matrices $$C_X^{(m)} = P_X C^{(m)} P_X^T, \quad (15)$$

$$C_{XY}^{(m)} = P_X C^{(m)} P_Y^T, \text{ and} \quad (16)$$

$$C_Y^{(m)} = P_Y C^{(m)} P_Y^T + \text{diag}\begin{bmatrix} 0 \\ P_{\bar{X}} \cdot \sigma_{N^{(m)}} \end{bmatrix}. \quad (17)$$

$\sigma_{N^{(m)}}$ is a column vector that contains the additive noise variances $\sigma_{N_i^{(m)}}^2 \forall i \in \{1, 2, \ldots, \dim \bar{X}\}$. The computation of these additive noise variances is described in the subsection on the computation of the redundancy bit rate distribution below (see equation (27)).

The GMM-based approximation for the MMSE estimator of equation (5) to estimate X given Y is $$\hat{x} = E\{X \mid Y = y\} \approx \sum_{m=1}^{M} p_{C|Y}(m \mid y) \mu_{X|Y}^{(m)} \text{ with} \quad (18)$$

$$p_{C|Y}(m \mid y) = \frac{p_C(m) \mathcal{N}(y \mid \mu_Y^{(m)}, C_Y^{(m)})}{p_Y(y)} \text{ and} \quad (19)$$

$$\mu_{X|Y}^{(m)} = \mu_X^{(m)} + C_{XY}^{(m)} (C_Y^{(m)})^{-1} (y - \mu_Y^{(m)}). \quad (20)$$

To achieve a low implementation complexity, the distribution $p\bar{X}V(\bar{x}, v)$ required for the parameter subset predictor 440 and for the parameter subset predictor 250 can also be generated from the single GMM that models pz(z). Using the relations $$\bar{X} = P_{\bar{x}} \cdot T \cdot P_x \cdot Z \quad (21)$$

and $$V = P_v \cdot Z, \quad (22)$$

where $P_v$ is the corresponding selector matrix that extracts the appropriate elements of Z to form V, an approximation of the MMSE estimator of equation (3) can easily be implemented.

Computation of the redundancy bit rate distribution is described in the following. The redundancy bit rate distribution has to be recomputed whenever the given overall redundancy bit rate changes. The redundancy bit rate distribution may also be recomputed when the packet structure is changed. The computation may be performed by the redundancy bit rate distributors 210 and 410 or the bit rate controller 142, which distributors or controller may be arranged either at the redundancy coder 120 or the parameter estimator 140.

The given overall redundancy bit rate is denoted by H. All in this text used bit rates are average bit rates expressed in bits/block. To calculate the redundancy bit rate distribution means to compute the set of individual bit rates $H_i$ spent on encoding the elements $\tilde{X}_i$ of $\tilde{X}$. The sum of all individual rates is the overall rate $$H = \sum_{i=1}^{dim \tilde{X}} H_i, \quad (23)$$

which is a constraint in the computation of the rate distribution. As was stated earlier, in general, a subset of the transformed source-coder parameters, i.e. a subset of predicted parameters generated from the first se of parameters, is encoded to form the redundancy encoding. Thus, some $H_i$ may be zero. One output of the redundancy bit rate distributors 210 and 410 or the bit rate controller 142 may be the index subset $$S = \{i : i \in \{1, 2, \ldots, \dim \tilde{x}\} \wedge H_i > 0\}$$

In case of independent parameters, different methods to derive the redundancy bit rate distribution may be applied.

If dependent parameters are encoded, the redundancy bit rate distribution may be derived on the basis of a Gaussian model (i.e., M=1). For a Gaussian model, the MMSE estimate is $\hat{x} = \mu_{X|Y}$ and the estimation error variance is $MSE = trC_{X|Y} = trC_{X|W} - MSE_\Delta$. $MSE_\Delta$ is the reduction in error variance due to having $\overline{X}$ in addition to the estimator side information W. It should be noted that for the computation of the redundancy bit rate distribution, the estimator side information W represents a known random variable for the given packet structure and network condition typical scenario. In the simplest case, the parameter subset contains only a single element $\tilde{X}_i$ of $\tilde{X}$. The encoding of only a single element may be the consequence of a constraint on the implementation complexity. The reconstruction of the single encoded element is modelled as $\hat{X} = \tilde{X}_i + N_i$. Upon applying the inversion lemma for a partitioned matrix and simplification of the trace the reduction in error variance is rewritten as $$MSE_\Delta = \frac{\|C_{X\tilde{X}_i} - C_{XW}C_W^{-1}C_{W\tilde{X}_i}\|^2}{\sigma_{N_i}^2 + \sigma_{\tilde{X}_i}^2 - C_{\tilde{X}_i W}C_W^{-1}C_{W\tilde{X}_i}}. \quad (24)$$

The optimal single variable $\tilde{X}_{i^*}$ is easily found by $i^* = \arg\max_i MSE_\Delta$. The additive noise variance $\sigma_{N_i}^2$ is a function of the rate spent on encoding the single element (see equation (25) below).

The additive noise in the model used above does not represent the actual quantization noise produced by the bank of uniform scalar quantizers 270. However, when the noise variance is selected such that the mutual information between the Gaussian variable and its noisy version is equal to the entropy of the quantized Gaussian, the same result is obtained as that obtained with the conventional backward-channel model of rate-distortion theory.

To account for the prediction prior to quantization, the computation of the additive noise variance $\sigma_{N_i}^2$ has to be based on the properties of the prediction residual $R_i$ instead of $\tilde{X}_i$. For the Gaussian model, the residual is also Gaussian with the variance $\sigma_{R_i}^2 = \sigma_{\tilde{X}_i}^2 - C_{\tilde{X}_i V}C_V^{-1}C_{V\tilde{X}_i}$, and the additive noise variance in equation (24) is computed by $$\sigma_{N_i}^2 = \frac{\sigma_{R_i}^2}{2^{2H_i} - 1}. \quad (25)$$

The rate saving due to predictive encoding is $$H_i' = \frac{1}{2}\log_2 \frac{\sigma_{\tilde{X}_i}^2 + \sigma_{N_i}^2}{\sigma_{R_i}^2 + \sigma_{N_i}^2}. \quad (26)$$

The form of equation (24) indicates a saturation in estimation performance at higher rates (or equivalently for $\sigma_{N_i}^2 \ll \sigma_{\tilde{X}_i}^2 - C_{\tilde{X}_i W}C_W^{-1}C_{W\tilde{X}_i}$). Therefore, for higher rates, a subset with more variables should be encoded. To find the optimal subset and redundancy bit rate distribution, equation (24) is modified and used in an iterative manner. W in equation (24) is replaced by $W_i$ that combines estimator side information W and all transformed parameters but $\tilde{X}_i$. $MSE_\Delta(H_i)$ is then obtained as a function of the entropy $H_i$ while all other entropies $H_{j \neq i}$ are considered to be fixed. The form of equation (24) allows a derivation of the slopes $\partial MSE/\partial H_i$ for all elements of the vector $\tilde{X}$. Rate is then iteratively redistributed from the variable with the flattest slope to the variable with the steepest slope under the constraints given by equation (23) and by $H_i \geq 0$. The procedure converges quickly towards a redundancy bit rate distribution where the slopes of the variables with non-zero bit rate are equal. The index subset S is then easily obtained from the redundancy bit rate distribution.

The bit rate control signal output by the redundancy bit rate distributors 210 and 410 or the bit rate controller 142 may include the quantization step sizes $\Delta_i$ of the bank of uniform scalar quantizers 270. These quantization step sizes are also required by the entropy coder 280 and by the entropy decoder 420. The quantization step sizes are determined based on statistical models for the prediction residuals $R_i$. For a given allocated bit rate $H_i$, the corresponding individual quantization step size $\Delta_i$ is selected such that the entropy of the quantized residual equals the allocated bit rate: $H(q_i(R_i)) = H_i$. Since the system works typically with relatively low rates, a look-up table for the quantizer step size versus entropy may be used. At higher rates, high-rate approximations may be used.

In a particular embodiment, the redundancy bit rate distributor 410 or bit rate controller may provide a bit rate control signal to the second-stage estimator 470 including the additive noise variances $\sigma_{N_i^{(m)}}^2$.

A statistical model for the supervector Z that includes the prediction residuals $R_i$ may not be required, but the additive noise variances used in equation (17) are calculated based on virtual uniform scalar quantizers $q_i'(\bullet)$ with step sizes $\Delta_i'$ such that $H(q_i'(\tilde{X}_i))=H_i+H_i'$:

$$\sigma^2_{N_i^{(m)}} = \frac{\sigma^2_{\tilde{X}_i^{(m)}}}{2^{2H(q_i'(\tilde{X}_i^{(m)}))} - 1}. \quad (27)$$

At sufficiently high resolutions, the entropy of the quantized Gaussian $H(q_i'(\tilde{X}_i^{(m)}))$ as a function of the virtual step size $\Delta_i'$ can be obtained by high-rate approximations well known in the art, and at vanishing rates, a look-up table may be used.

Although the invention above has been described in connection with preferred embodiments of the invention, it will be evident for a person skilled in the art that several modifications are conceivable without departing from the scope of the invention as defined by the following claims.

The invention claimed is:

1. An apparatus for encoding a source signal to be transmitted across a packet data network, the apparatus comprising:
   a first coder for generating a first set of parameters from said source signal and quantized parameters from said first set of parameters, and for performing a primary encoding of said quantized parameters;
   a redundancy coder for performing a redundant encoding of a second set of parameters of the source signal using a subset of the first set of parameters and a delayed set of said quantized parameters, said second set of parameters being a subset of a transformed set of the first set of parameters, wherein the redundancy coder is adapted to encode the second set of parameters into a redundant bit stream having a variable bit rate, the variable bit rate corresponding to a received bit rate control signal; and
   a bit rate controller providing the bit rate control signal in response to a packet-loss statistics value received from a packet-loss statistics calculator connected to said packet data network,
   wherein the redundancy coder includes:
      a delay unit for delaying the quantized parameters generated by the first coder from the first set of parameters,
      a parameter predictor for predicting, under control of the bit rate control signal, a set of predicted quantized parameters based on the delayed quantized parameters, and
      a subtractor for generating redundant parameters by subtraction of the set of predicted quantized parameters from the subset of the first set of parameters generated by the first coder.

2. The apparatus as defined in claim 1, wherein said bit rate controller provides the bit rate control signal in response to both said packet-loss statistics value and information about conditions of said packet data network.

3. The apparatus as defined in claim 2, wherein said information about conditions of said packet data network includes at least one of the following network parameters: current data load in said packet data network, data load policy of said packet data network and current cost per bit per second in said packet data network.

4. The apparatus as defined in claim 1, wherein said redundancy coder is adapted to encode at least a part of the difference between said subset of the first set of parameters and predicted values of said delayed quantized parameters.

5. The apparatus as defined in claim 1, wherein said packet-loss statistics calculator estimates packet-loss statistics values by counting missing packets.

6. The apparatus as defined in claim 1, wherein said redundancy coder further includes:
   at least one quantizer for quantizing, under control of the bit rate control signal, said redundant parameters, and
   an entropy coder for coding, under control of the bit rate control signal, the quantized redundant parameters into said redundant bit stream.

7. The apparatus as defined in claim 6, wherein said at least one quantizer is a vector quantizer.

8. The apparatus as defined in claim 6, wherein said at least one quantizer is a scalar quantizer.

9. The apparatus as defined in claim 6, wherein said at least one quantizer operates on the basis of a statistical model.

10. The apparatus as defined in claim 9, wherein said statistical model is a Gaussian mixture model.

11. The apparatus as defined in claim 1, wherein said redundancy coder further includes a parameter selector for selecting from said first set of parameters generated by said first coder, under control of the bit rate control signal, said subset of the first set of parameters.

12. The apparatus as defined in claim 11, wherein said redundancy coder further includes a parameter transformer for transforming said first set of parameters generated by said first coder to reduce mutual dependency between parameters in said first set of parameters and for providing the transformed parameters to said parameter selector.

13. The apparatus as defined in claim 12, wherein the transform applied by said parameter transformer to said first set of parameters is a Karhunen-Loève transform.

14. The apparatus as defined in claim 1, wherein the bit rate control signal includes the number of bits available for transmission of data packets.

15. The apparatus as defined in claim 6, wherein the bit rate control signal provided to said at least one quantizer and said entropy coder includes information about quantization step sizes.

16. The apparatus as defined in claim 1, wherein the primary encoding of one source signal segment is grouped with the redundant encoding of another source signal segment into a data packet to be transmitted over said packet data network.

17. The apparatus as defined in claim 1, wherein said source signal is one of the group comprised of a speech signal, an audio signal, a motion picture and an audio-visual signal.

18. A system for transmitting a sequence of data packets across a packet data network, wherein each of the transmitted data packets includes a primary encoding and a redundant encoding of parameters representing a source signal, said system comprising:
   a bit rate controller providing a bit rate control signal in response to a packet-loss statistics value received from a packet-loss statistics calculator connected to said packet data network;
   a first coder for generating a first set of parameters from a source signal and quantized parameters from said first set of parameters, and for performing a primary encoding of said quantized parameters;
   a redundancy coder for performing a redundant encoding of a second set of parameters of the source signal using a subset of the first set of parameters and a delayed set of said quantized parameters, said second set of parameters being a subset of a transformed set of the first set of parameters, wherein the redundancy coder is adapted to encode the second set of parameters into a redundant bit stream having a variable bit rate, the variable bit rate corresponding to the bit rate control signal provided by the bit rate controller;

a first decoder for performing a decoding of the primary encoding into a set of primary decoded parameters; and a parameter estimator for modelling, under the control of the bit rate control signal provided by the bit rate controller, a joint distribution of a set of decoded redundant parameters generated from the redundant encoding and said set of primary decoded parameters, wherein said joint distribution comprises a set of estimated parameters to be output from the parameter estimator, for estimating said estimated parameters based on the modelled distribution, the set of decoded redundant parameters and said set of primary decoded parameters.

19. A method for encoding a source signal to be transmitted across a packet data network, said method comprising the steps of:

performing a primary encoding of a first set of parameters generated from said source signal;

generating quantized parameters from the first set of parameters;

performing a redundant encoding of a second set of parameters into a redundant bit stream having a variable bit rate, wherein the second set of parameters is generated from a subset of the first set of parameters and a delayed set of said quantized parameters, said second set of parameters being a subset of a transformed set of the first set of parameters, the variable bit rate corresponding to a received bit rate control signal; and providing the bit rate control signal in response to a packet-loss statistics value characteristic of said packet data network, wherein said step of performing the redundant encoding includes:

delaying the quantized parameters generated from the first set of parameters;

predicting, under control of the bit rate control signal, a set of predicted quantized parameters based on the delayed quantized parameters; and generating redundant parameters by subtraction of the set of predicted quantized parameters from said subset of the first set of parameters.

20. The method as defined in claim 19, wherein the bit rate control signal is provided in response to both said packet-loss statistics value and information about conditions of said packet data network.

21. The method as defined in claim 20, wherein said information about conditions of said packet data network includes at least one of the following network parameters: current data load in said packet data network, data load policy of said packet data network and current cost per bit per second in said packet data network.

22. The method as defined in claim 19, wherein at least a part of the difference between said subset of the first set of parameters and predicted values of said delayed quantized parameters is encoded during said step of performing a redundant encoding.

23. The method as defined in claim 19, wherein said packet-loss statistics value corresponds to a number of missing packets.

24. The method as defined in claim 19, wherein said step of performing the redundant encoding further includes the following steps:

quantizing, under control of the bit rate control signal, said redundant parameters; and coding, under control of the bit rate control signal, the quantized redundant parameters into said redundant bit stream.

25. The method as defined in claim 24, wherein said step for quantizing said redundant parameters is a vector quantization.

26. The method as defined in claim 24, wherein said step for quantizing said redundant parameters is a scalar quantization.

27. The method as defined in claim 19, wherein said step of performing the redundant encoding further includes the step of selecting from said first set of parameters, under control of the bit rate control signal, said subset of the first set of parameters.

28. The method as defined in claim 27, wherein said step of performing the redundant encoding further includes, prior to the step of selecting a subset of said first set of parameters, the step of transforming said first set of parameters to reduce mutual dependency between parameters in said first set of parameters.

29. The method as defined in claim 28, wherein the step of transforming is based on a Karhunen-Loève transform.

30. The method as defined in claim 19, wherein the bit rate control signal includes the number of bits available for transmission of data packets.

31. The method as defined in claim 19, wherein the bit rate control signal includes information about quantization step sizes.

32. The method as defined in claim 19, further comprising a step of grouping the primary encoding of one source signal segment with the redundant encoding of another source signal segment into a data packet to be transmitted over said packet data network.

33. The method as defined in claim 19, wherein said source signal is one of the group comprised of a speech signal, an audio signal, a motion picture and an audio-visual signal.

* * * * *